(12) United States Patent
Taracila et al.

(10) Patent No.: US 10,379,181 B2
(45) Date of Patent: Aug. 13, 2019

(54) SYSTEMS AND METHODS FOR COMMON MODE TRAPS IN MRI SYSTEMS

(71) Applicant: General Electric Company, Schenectady, NY (US)

(72) Inventors: Victor Taracila, Orange Village, OH (US); Robert Steven Stormont, Hartland, WI (US); Fraser John Laing Robb, Aurora, OH (US)

(73) Assignee: General Electric Company, Schenectady, NY (US)

( * ) Notice: Subject to any disclaimer, the term of this patent is extended or adjusted under 35 U.S.C. 154(b) by 505 days.

(21) Appl. No.: 15/166,636

(22) Filed: May 27, 2016

(65) Prior Publication Data

US 2017/0343627 A1  Nov. 30, 2017

(51) Int. Cl.
  *G01R 33/36* (2006.01)
(52) U.S. Cl.
  CPC .................. *G01R 33/3685* (2013.01)
(58) Field of Classification Search
  CPC .................................................. G01R 33/3685
  USPC ....................................................... 324/322
  See application file for complete search history.

(56) References Cited

U.S. PATENT DOCUMENTS

| | | | | |
|---|---|---|---|---|
| 4,109,223 A * | 8/1978 | Tenkman | ............. | A61B 5/0424 128/908 |
| 5,015,204 A * | 5/1991 | Sakamoto | .......... | H01R 13/6633 336/192 |
| 5,195,232 A * | 3/1993 | Frederick | ............. | H03H 1/0007 29/602.1 |
| 5,744,755 A * | 4/1998 | Gasque, Jr. | ........ | H01B 11/1891 174/108 |
| 6,033,593 A * | 3/2000 | Onizuka | ............. | C04B 35/2633 252/62.62 |
| 6,456,182 B1 * | 9/2002 | Katayama | ............. | H01F 17/062 336/170 |
| 9,642,670 B2 * | 5/2017 | Johnson | ............. | A61B 18/1206 |
| 2005/0219006 A1 * | 10/2005 | Suenaga | ................. | H01F 17/06 333/12 |
| 2005/0270031 A1 * | 12/2005 | Oppelt | ............... | G01R 33/3614 324/322 |
| 2006/0181398 A1 * | 8/2006 | Martich | .................. | H04L 12/66 340/538 |

(Continued)

OTHER PUBLICATIONS

Stormont, R. et al., "Systems and Methods for MRI Common Mode Traps," U.S. Appl. No. 14/730,741, filed Jun. 4, 2015, 33 pages.

*Primary Examiner* — Jermele M Hollington
*Assistant Examiner* — Demetrius R Pretlow
(74) *Attorney, Agent, or Firm* — McCoy Russell LLP

(57) ABSTRACT

Various methods and systems are provided for a common mode trap for a magnetic resonance imaging (MRI) apparatus. In one embodiment, a common mode trap for an MRI apparatus comprises: a first conductor and a second conductor counterwound around a length of a central conductor, wherein the first and the second conductors are radially spaced a first distance from the central conductor at first and second ends of the length, and wherein the first and the second conductors are radially spaced a second distance larger than the first distance from the central conductor at a midpoint of the length. In this way, coupling and subsequent detuning of common mode traps provided adjacent to one another may be prevented.

20 Claims, 12 Drawing Sheets

(56) References Cited

U.S. PATENT DOCUMENTS

| | | | |
|---|---|---|---|
| 2006/0181459 A1* | 8/2006 | Aekins | H04B 3/32 343/700 MS |
| 2008/0051854 A1* | 2/2008 | Bulkes | A61N 1/37211 607/60 |
| 2008/0136415 A1* | 6/2008 | de Rooij | G01R 33/3621 324/322 |
| 2008/0243218 A1* | 10/2008 | Bottomley | A61N 1/05 607/116 |
| 2008/0262584 A1* | 10/2008 | Bottomley | A61N 1/05 607/119 |
| 2009/0021261 A1* | 1/2009 | Chmielewski | G01R 33/3685 324/322 |
| 2010/0174348 A1* | 7/2010 | Bulkes | A61N 1/05 607/116 |
| 2010/0218970 A1* | 9/2010 | Eshima | H01B 7/228 174/108 |
| 2010/0329527 A1* | 12/2010 | Iannotti | G01R 33/3621 382/131 |
| 2013/0069615 A1* | 3/2013 | Choi | H02M 1/44 323/304 |
| 2014/0154920 A1* | 6/2014 | Dinh | H01F 27/2823 439/620.01 |
| 2015/0008926 A1* | 1/2015 | Yang | G01R 33/3685 324/322 |
| 2015/0018917 A1* | 1/2015 | Wechter | A61N 1/05 607/116 |
| 2015/0108983 A1* | 4/2015 | Chang | G01R 33/3815 324/322 |
| 2015/0119871 A1* | 4/2015 | Johnson | A61B 18/1206 606/34 |
| 2015/0200645 A1* | 7/2015 | Waks | H03H 7/0115 333/175 |
| 2015/0206646 A1* | 7/2015 | Dinh | H01F 17/045 336/188 |
| 2016/0127157 A1* | 5/2016 | Wojnowski | H04L 25/085 375/257 |
| 2017/0178783 A1* | 6/2017 | Lou | H01F 27/24 |

\* cited by examiner

SYSTEMS AND METHODS FOR COMMON MODE TRAPS IN MRI SYSTEMS

FIELD

Embodiments of the subject matter disclosed herein relate to magnetic resonance imaging (MRI), and more particularly, to common mode traps for an MRI system.

BACKGROUND

Magnetic resonance imaging (MRI) is a medical imaging modality that can create pictures of the inside of a human body without using x-rays or other ionizing radiation. MRI uses a superconducting magnet to create a strong, uniform, static magnetic field. When a human body, or part of a human body, is placed in the magnetic field, the nuclear spins associated with the hydrogen nuclei in tissue water become polarized, wherein the magnetic moments associated with these spins become preferentially aligned along the direction of the magnetic field, resulting in a small net tissue magnetization along that axis. MRI systems also include gradient coils that produce smaller amplitude, spatially-varying magnetic fields with orthogonal axes to spatially encode the MR signal by creating a signature resonance frequency at each location in the body. Radio frequency (RF) coils are then used to create pulses of RF energy at or near the resonance frequency of the hydrogen nuclei, which add energy to the nuclear spin system. As the nuclear spins relax back to their rest energy state, they release the absorbed energy in the form of an RF signal. This signal is detected by the MRI system and is transformed into an image using a computer and known reconstruction algorithms.

As mentioned, RF coils are used in MRI systems to transmit RF excitation signals and to receive MR signals, the RF signals emitted by an imaging subject. Coil interfacing cables may be used to transmit signals between the RF coils and other aspects of the processing system, for example to control the RF coils and/or to receive information from the RF coils. The coil interfacing cables may be disposed within the bore of the MRI system and subjected to electromagnetic fields produced and used by the MRI system. The cables may support transmitter-driven common mode currents which create field distortions and/or unpredictable heating of components. These field distortions may result in a shadow of the cables appearing within an image reconstructed from received MR signals.

Conventionally, baluns or common mode traps that provide high common mode impedances may be utilized to mitigate the effect of transmitter-driven currents. However, placing the common mode traps or blocking circuits at appropriate locations may be difficult, as the appropriate placement may vary based on the positioning of a cable or coil associated with the common mode traps. Also, excessive voltage and/or power dissipation may occur even if conventional common mode traps or blocking circuits are placed at appropriate locations.

Further, baluns or common mode traps positioned too close to each other on a cable may become coupled due to fringe magnetic fields, thereby resulting in a detuning of the baluns which may adversely affect the functioning of the baluns.

BRIEF DESCRIPTION

In one embodiment, a common mode trap for a magnetic resonance imaging (MRI) apparatus comprises: a first conductor and a second conductor counterwound around a length of a central conductor, wherein the first and the second conductors are radially spaced a first distance from the central conductor at first and second ends of the length, and wherein the first and the second conductors are radially spaced a second distance larger than the first distance from the central conductor at a midpoint of the length. In this way, coupling and subsequent detuning of common mode traps provided adjacent to one another may be prevented, and the density of common mode traps in a common mode trap assembly may be increased.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 8:
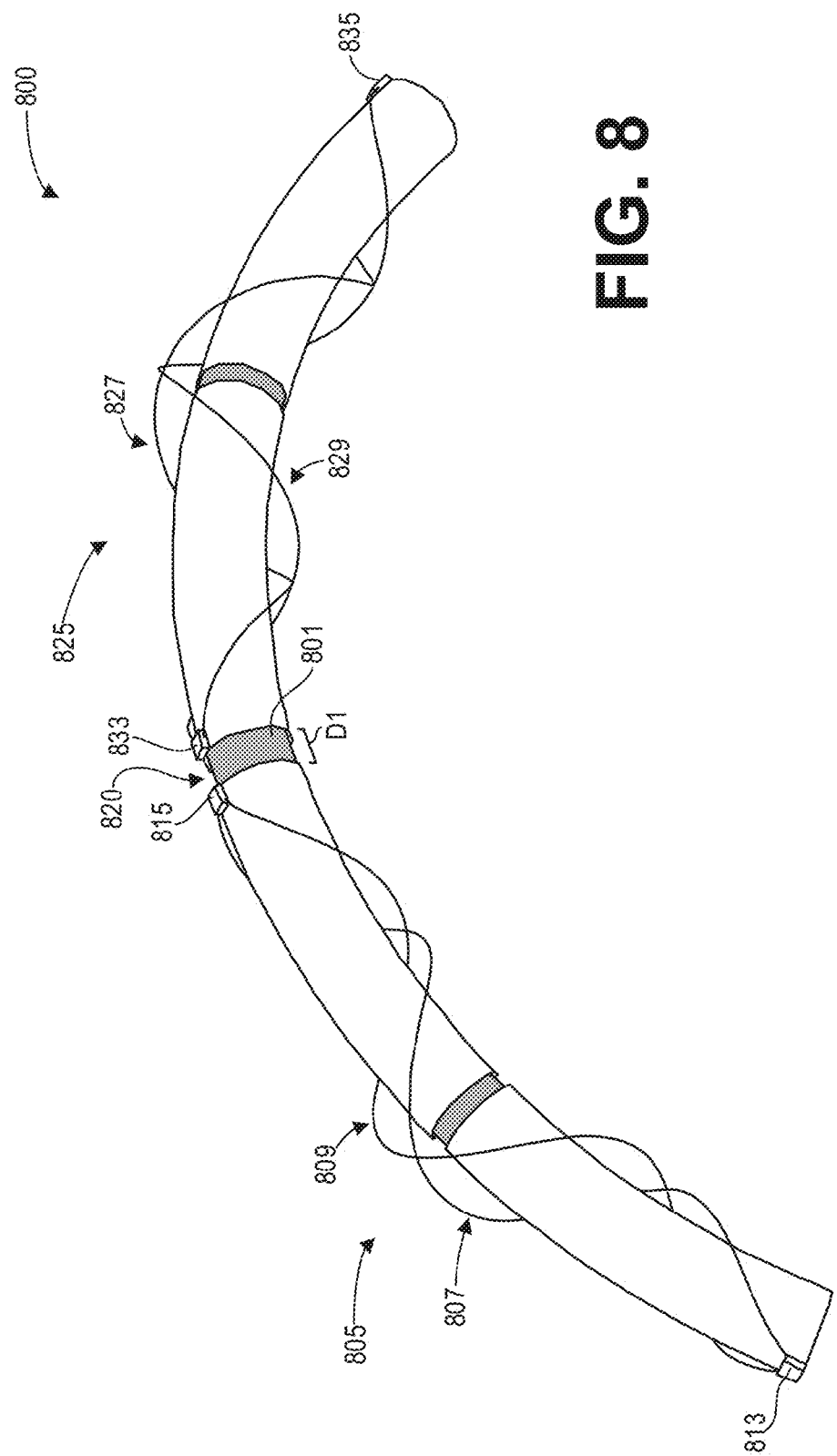
FIG. 8 is a perspective view of a common mode trap assembly on a curved cable according to an embodiment of the invention.
Figure 9:
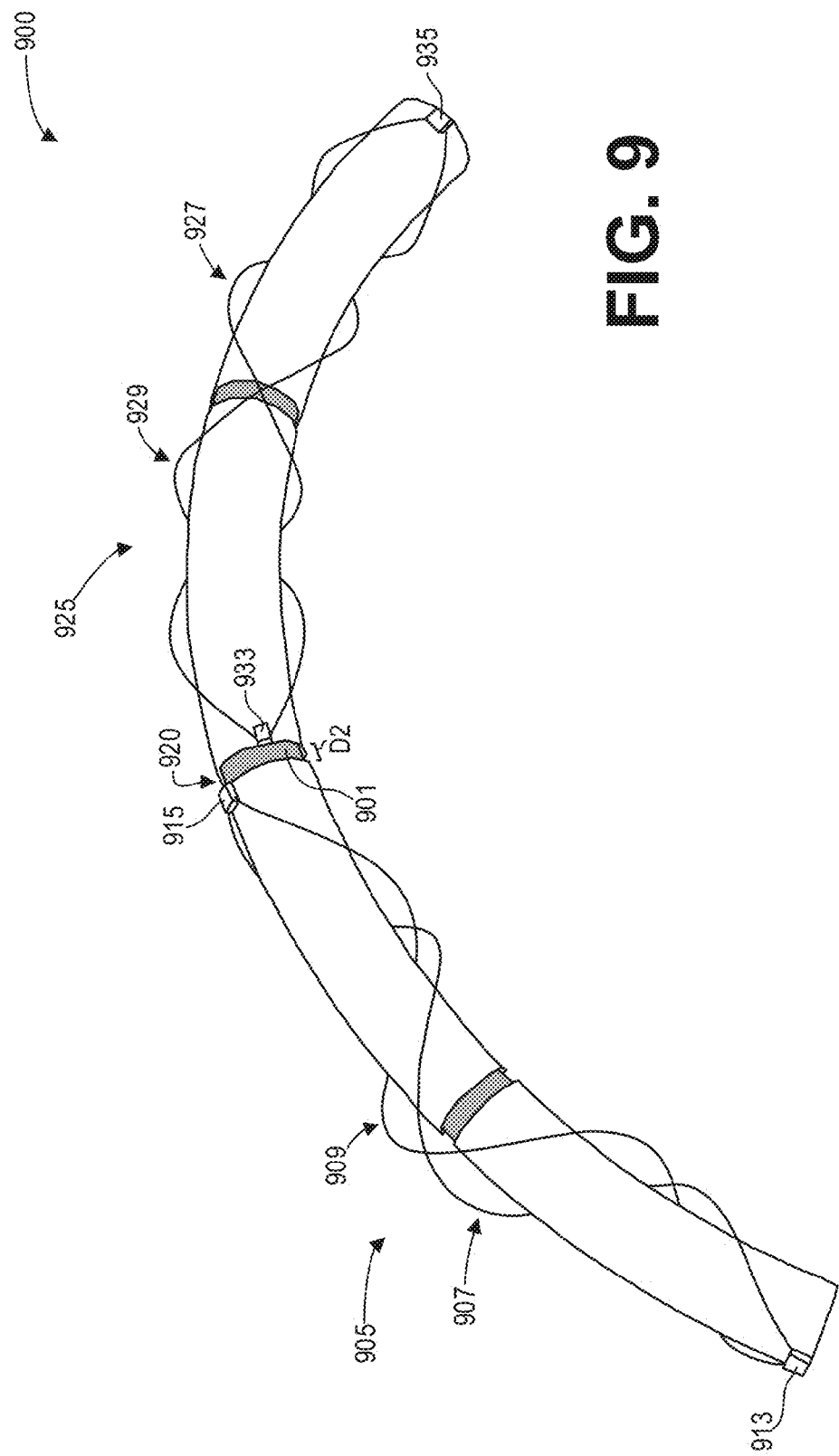
FIG. 9 is a perspective view of a common mode trap assembly in a rotated configuration on a curved cable according to an embodiment of the invention.
Figure 10:
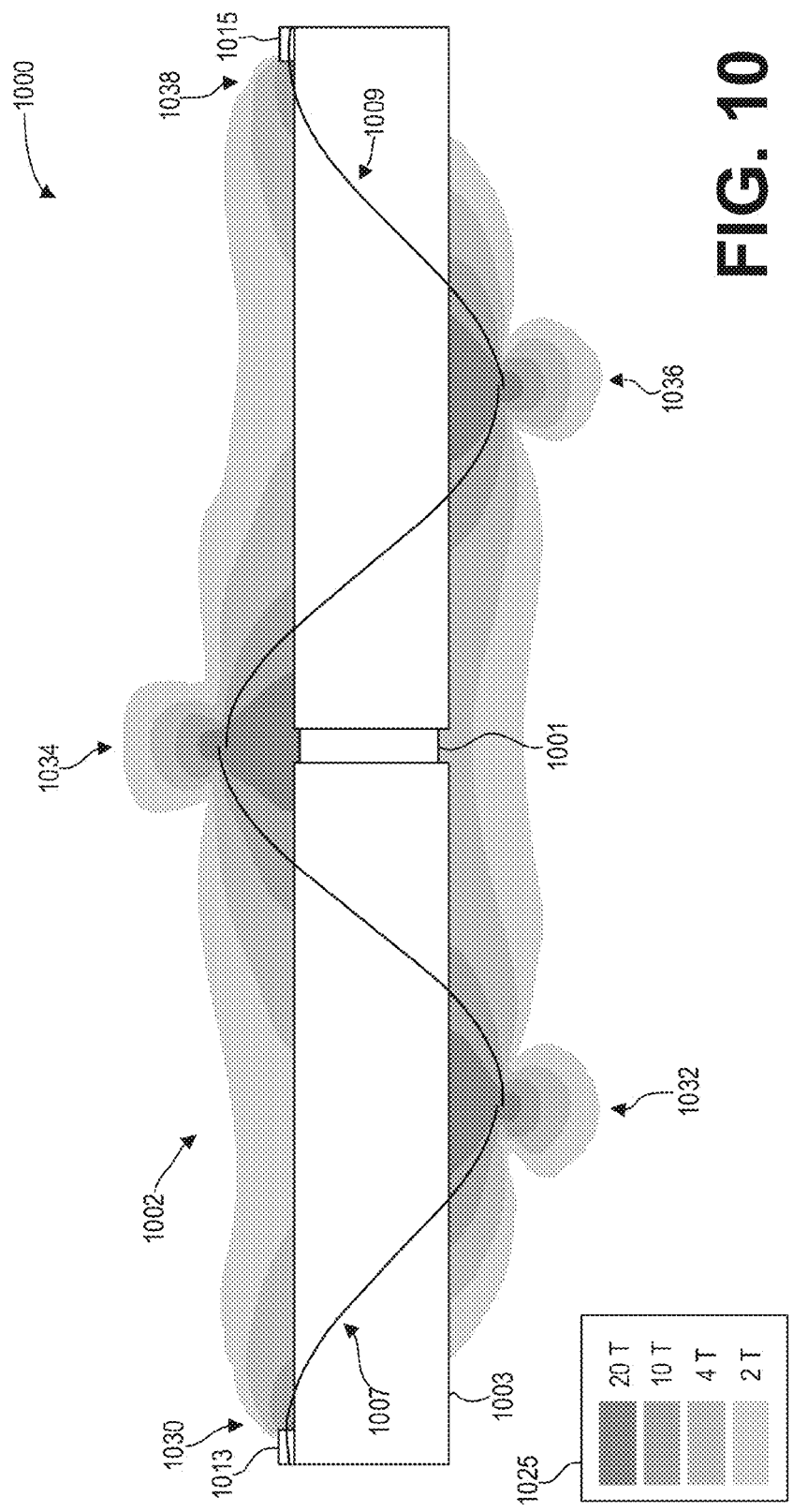
FIG. 10 is a graph illustrating magnetic field strength controlled by a common mode trap according to an embodiment of the invention.
Figure 11:
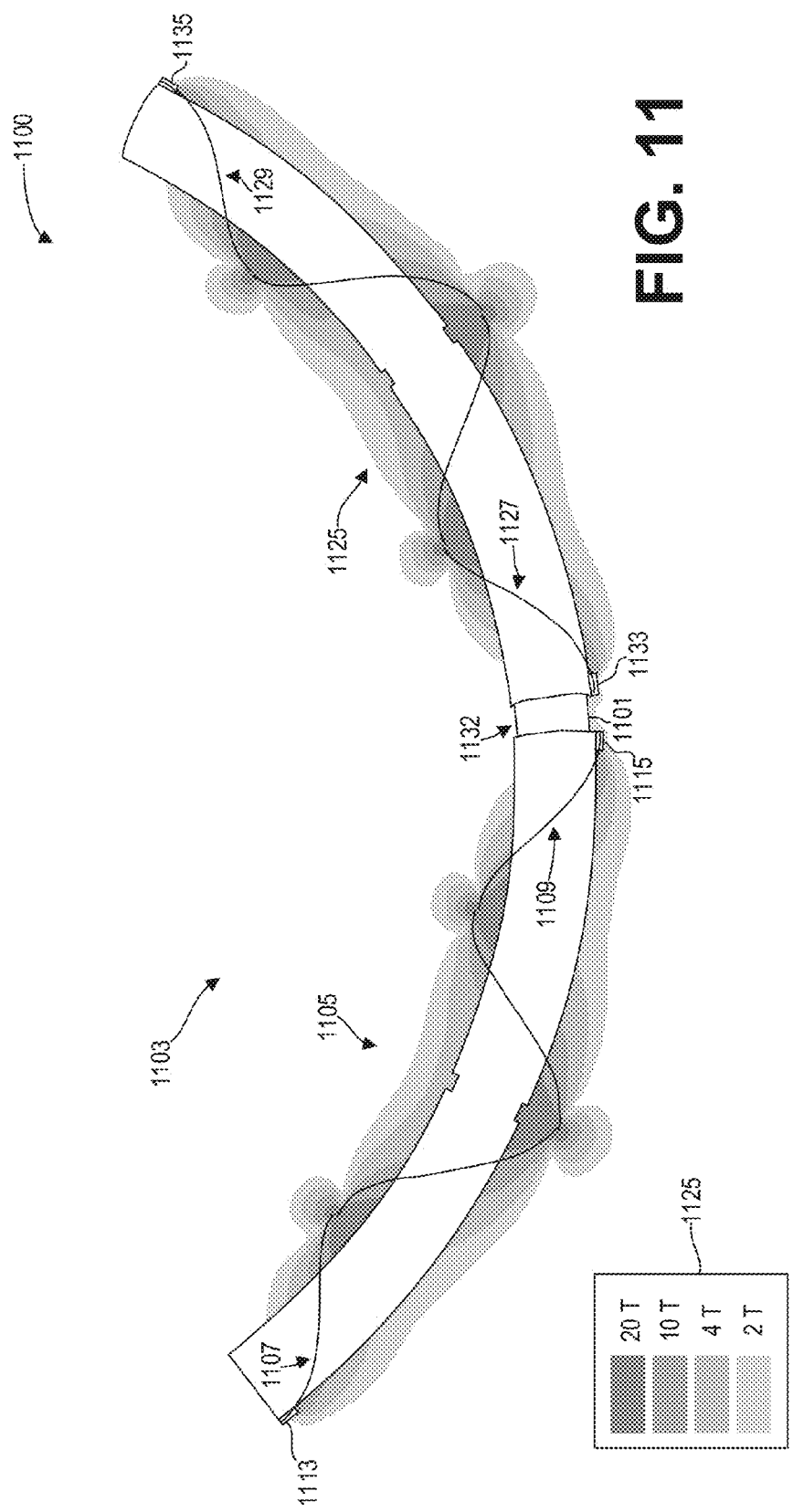
FIG. 11 is a graph illustrating magnetic field strength controlled by a common mode trap assembly according to an embodiment of the invention.
Figure 12:
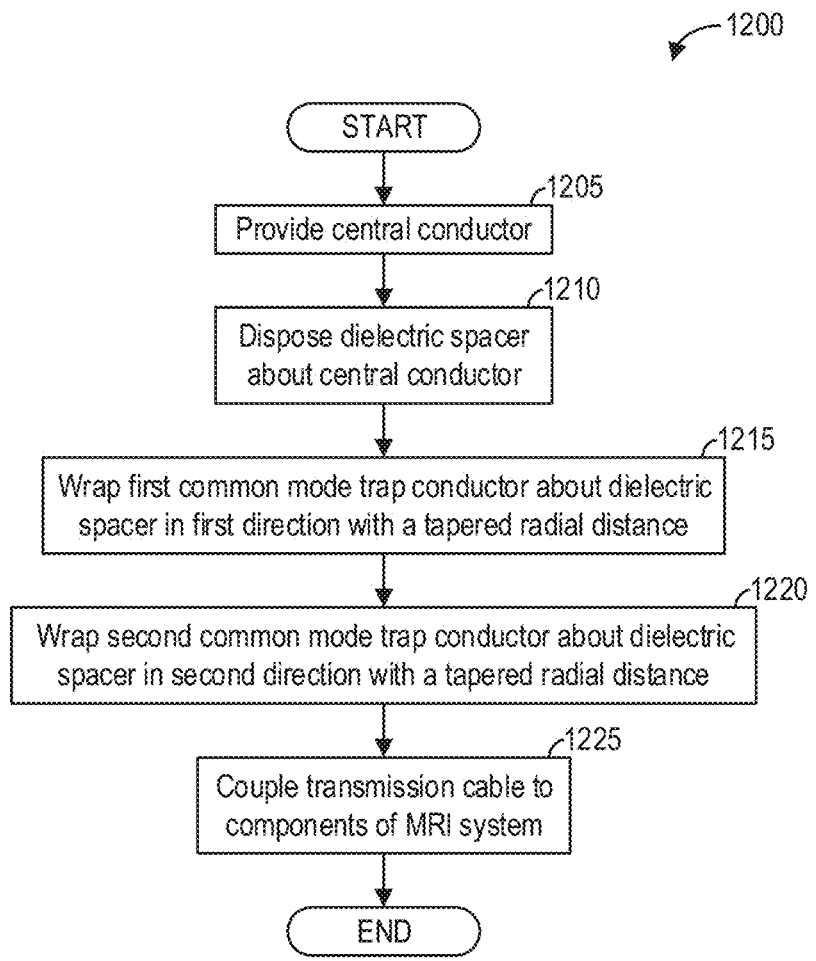
FIG. 12 is a high-level block diagram illustrating an example method for a common mode trap according to an embodiment of the invention.
Figure 13:
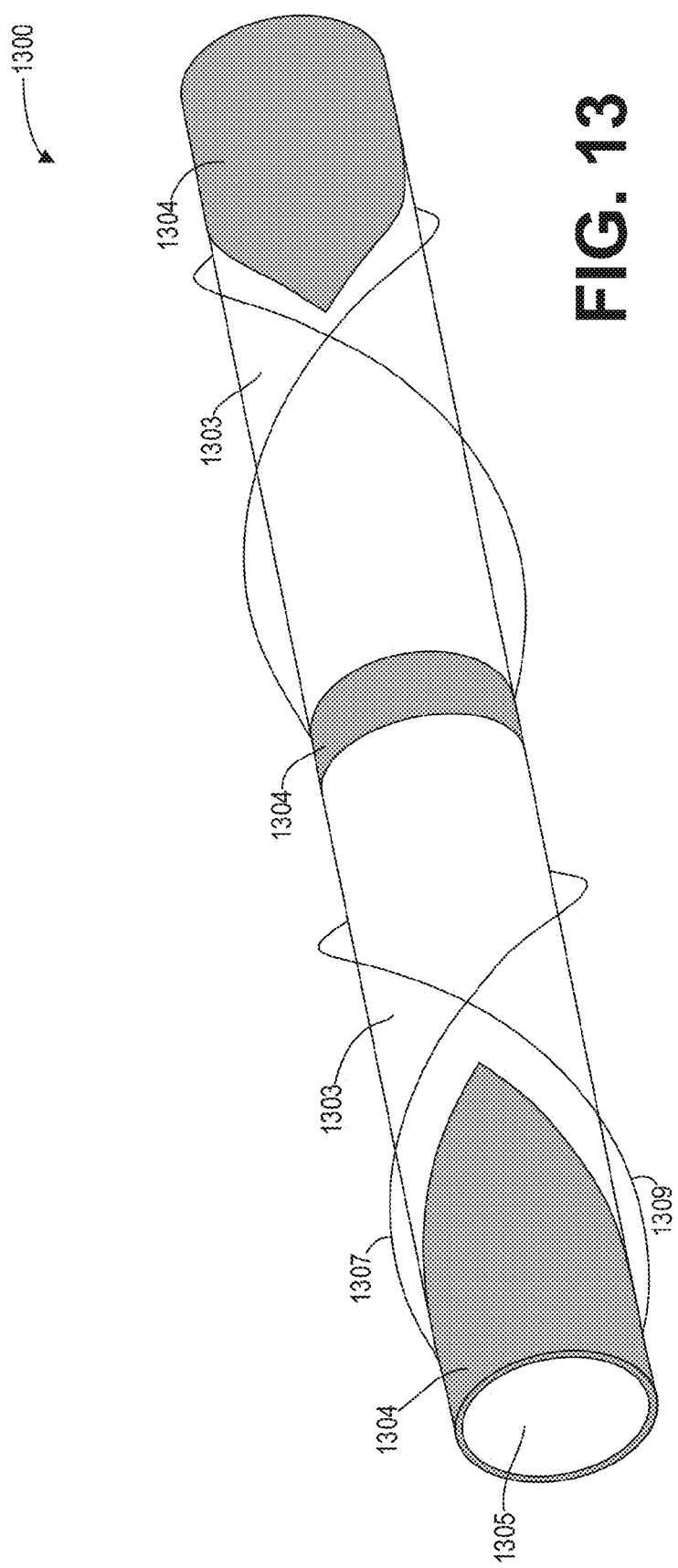
FIG. 13 is a perspective view of a common mode trap with a trimmed shielding according to an embodiment of the invention.
Figure 14:
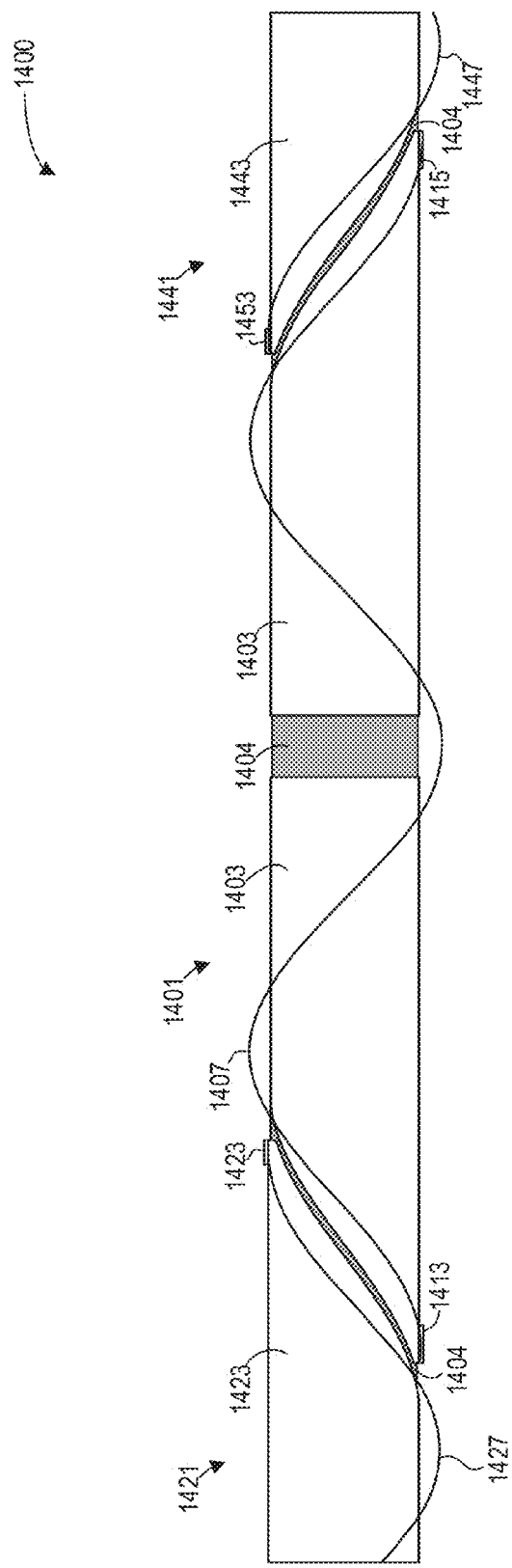
FIG. 14 is a side view of a common mode trap assembly comprising a plurality of common mode traps with trimmed shielding according to an embodiment of the invention.
Figure 15:
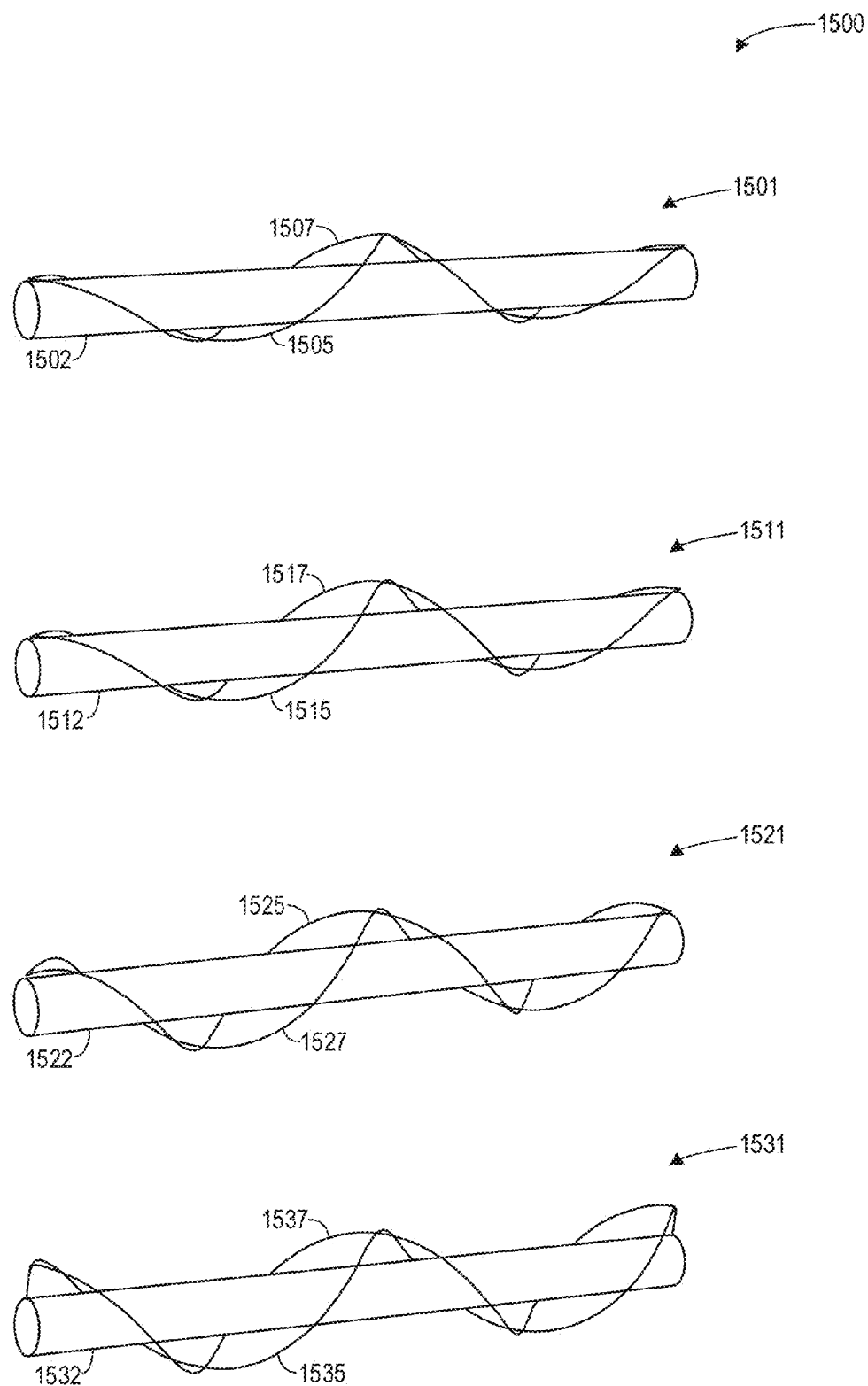
FIG. 15 shows a plurality of common mode trap configurations with different tapering orders according to an embodiment of the invention.

The following description relates to various embodiments of a common mode trap for MRI systems. In particular, systems are provided for a tapered spiral configurations in a common mode trap assembly for an MRI system, such as the MRI system depicted in FIG. 1. As shown in FIG. 2, a common mode trap assembly comprising a plurality of common mode traps may be placed on a cable for communicating received MR data. FIGS. 3-7 show various views of a common mode trap. FIG. 8 shows a common mode trap assembly on a curved cable, while FIG. 9 shows a common mode trap assembly in a rotated configuration on a curved cable. As depicted, the common mode traps include spiral-wound filaments which taper towards the ends of the common mode traps. As depicted in FIGS. 10-11, the tapering of the filaments reduces the magnetic field strength at the ends of the common mode traps, thereby reducing coupling between common mode traps. A method for constructing a common mode trap is shown in FIG. 12. In some examples, adjacent common mode traps may be overlapped or interleaved by trimming the exterior shielding, as shown in FIGS. 13-14, thereby increasing the density of common mode traps on a cable or central conductor. Further, the tapering order of the spiral-wound filaments may be adjusted to obtain a desired fringe field, as depicted in FIG. 15.

Figure 1:
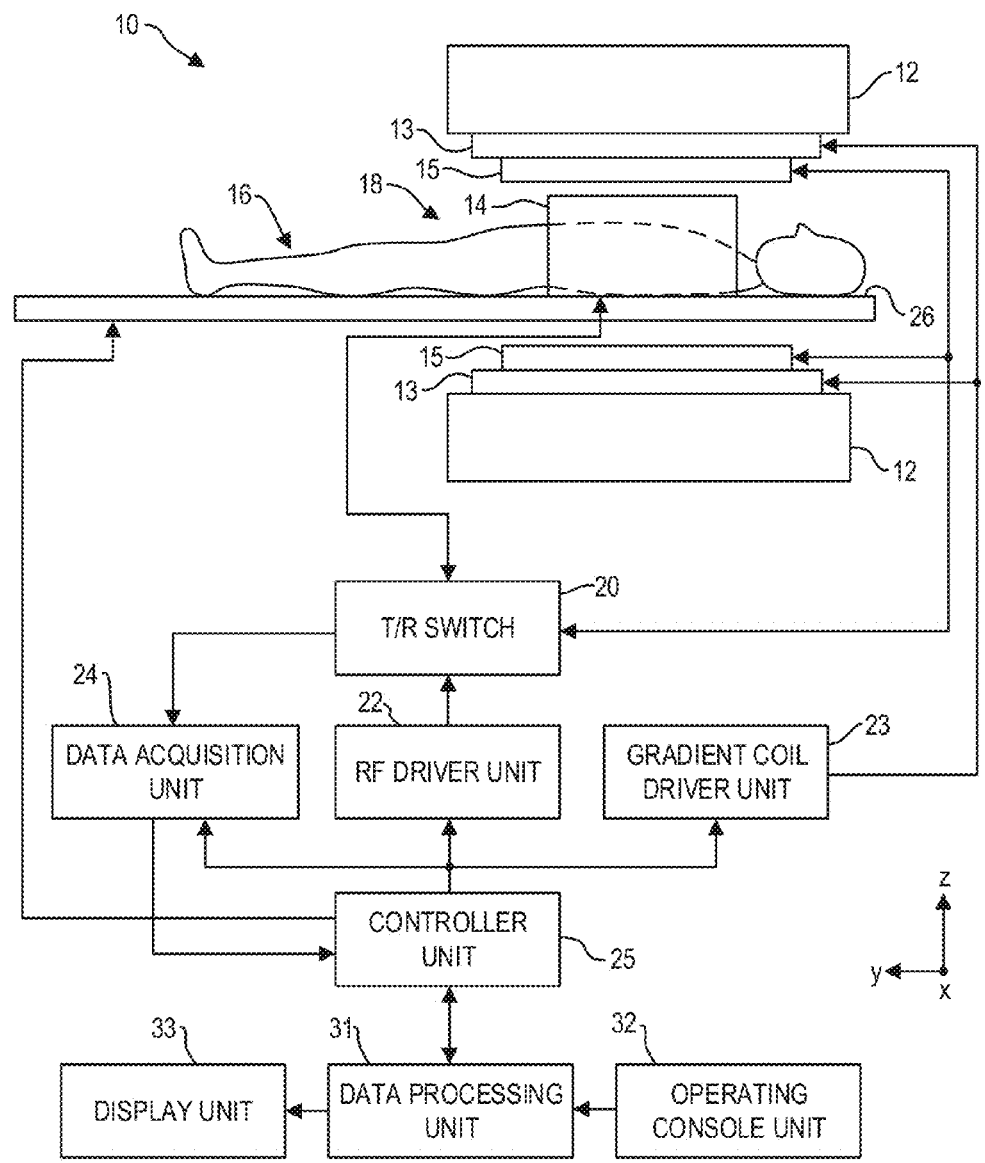
FIG. 1 is a block diagram of an MRI system according to an embodiment of the invention.
Figure 2:
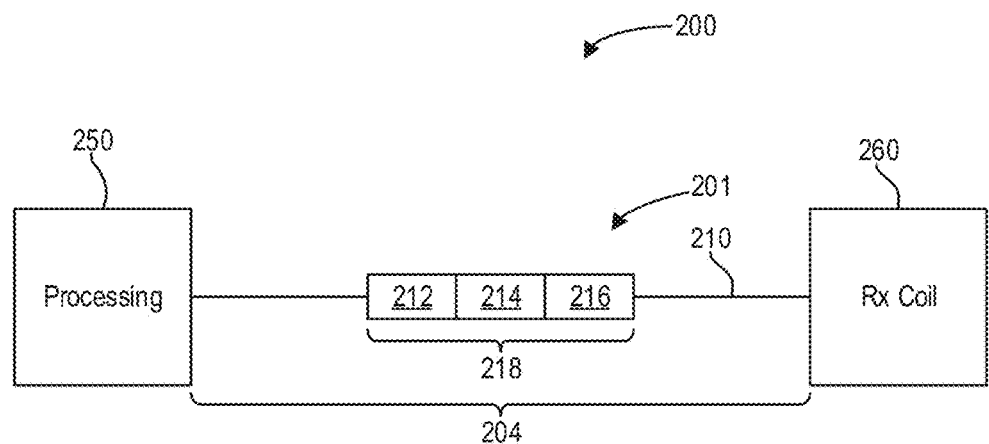
FIG. 2 is a block diagram illustrating a continuous common mode trap assembly according to an embodiment of the invention.

FIG. 1 illustrates a magnetic resonance imaging (MRI) apparatus 10 that includes a magnetostatic field magnet unit 12, a gradient coil unit 13, an RF coil unit 14, an RF body coil unit 15, a transmit/receive (T/R) switch 20, an RF port interface 21, an RF driver unit 22, a gradient coil driver unit 23, a data acquisition unit 24, a controller unit 25, a patient bed 26, a data processing unit 31, an operating console unit 32, and a display unit 33. The MRI apparatus 10 transmits electromagnetic pulse signals to a subject 16 placed in an imaging space 18 with a magnetostatic field formed to perform a scan for obtaining magnetic resonance signals from the subject 16 to reconstruct an image of the slice of the subject 16 based on the magnetic resonance signals thus obtained by the scan.

The magnetostatic field magnet unit 12 includes, for example, typically an annular superconducting magnet, which is mounted within a toroidal vacuum vessel. The magnet defines a cylindrical space surrounding the subject 16, and generates a constant primary magnetostatic field along the Z direction of the cylinder space.

The MRI apparatus 10 also includes a gradient coil unit 13 that forms a gradient magnetic field in the imaging space 18 so as to provide the magnetic resonance signals received by the RF coil unit 14 with three-dimensional positional information. The gradient coil unit 13 includes three gradient coil systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction of the subject 16, to select the slice; and the RF coil unit 14 transmits an RF pulse to a selected slice of the subject 16 and excites it. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In the static magnetic field space or imaging space 18 where a static magnetic field is formed by the magnetostatic field magnet unit 12, the RF coil unit 14 transmits, based on a control signal from the controller unit 25, an RF pulse that is an electromagnet wave to the subject 16 and thereby generates a high-frequency magnetic field. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. The RF coil unit 14 may transmit and receive an RF pulse using the same RF coil.

The RF body coil unit 15 is disposed, for example, to enclose the imaging space 18, and produces RF magnetic field pulses orthogonal to the main magnetic field produced by the magnetostatic field magnet unit 12 within the imaging space 18 to excite the nuclei. In contrast to the RF coil unit 14, which may be easily disconnected from the MR apparatus 10 and replaced with another RF coil unit, the RF body coil unit 15 is fixedly attached and connected to the MR apparatus 10. Furthermore, whereas local coils such as those comprising the RF coil unit 14 can transmit to or receive signals from only a localized region of the subject 16, the RF body coil unit 15 generally has a larger coverage area and can be used to transmit or receive signals to the whole body of the subject 16. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode, a receive-only mode, or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coil unit 14 and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 14.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a preamplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the preamplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

Different RF coil units may be utilized for different scanning objectives. To that end, the RF coil unit 14 may be disconnected from the MRI apparatus 10, so that a different RF coil unit may be connected to the MRI apparatus 10. The RF coil unit 14 may be coupled to the T/R switch 20, and thus to the RF driver unit 22 and the data acquisition unit 24, via a connector 17 and an RF port interface 21. Specifically, the connector 17 may be plugged into the RF port interface 21 to electronically couple the RF coil unit 14 to the T/R switch 20. Using a single connector 17, fixedly attached to the RF coil unit 14, enables easy interchangeability of RF coil units.

During a scan, coil interfacing cables (not shown) may be used to transmit signals between the RF coils (e.g., RF coil unit 14) and other aspects of the processing system (e.g., data acquisition unit 24, controller unit 25, and so on), for example to control the RF coils and/or to receive information from the RF coils. The coil interfacing cables may be disposed within the bore or imaging space 18 of the MRI apparatus 10 and subjected to electro-magnetic fields produced and used by the MRI apparatus 10. The cables may support transmitter driven common mode currents which create field distortions and/or unpredictable heating of components. Baluns or common mode traps that provide high common mode impedances may be utilized to mitigate the effect of transmitter driven currents. Various embodiments of such common mode traps and common mode trap assemblies are described further herein.

FIG. 2 illustrates a block schematic diagram of a continuous common mode trap assembly 200 formed in accordance with various embodiments. The common mode trap assembly 200 may be configured, for example, for use in the bore of an MRI system, such as the MRI apparatus 10 described herein above. For example, in the illustrated embodiment, the common mode trap assembly 200 is configured as a transmission cable 201 configured for transmission of signals between a processing unit (or controller) 250 and a receive coil 260 of an MRI system. In the illustrated embodiment, the transmission cable 201 (or common mode trap assembly 200) includes a central conductor 210 and plural common mode traps 212, 214, 216. It may be noted that, while the common mode traps 212, 214, and 216 are depicted as distinct from the central conductor 210, in some embodiments, the common mode traps 212, 214, 216 may be integrally formed with or as a part of the central conductor 210.

The central conductor 210 in the illustrated embodiment has a length 204, and is configured to transmit a signal between the MRI receive coil 260 and at least one processor of an MRI system (e.g., processing unit 250). The central conductor 210 may include one or more of a ribbon conductor, a wire, or a coaxial cable bundle, for example. The length 204 of the depicted central conductor 210 extends from a first end of the central conductor 210 (which is coupled to the processing unit 250) to a second end of the central conductor 210 (which is coupled to the MRI receive coil 260). In some embodiments, the central conductor may pass through a central opening of the common mode traps 212, 214, 216.

The depicted common mode traps 212, 214, 216 (which may be understood as cooperating to form a common mode trap unit 218), as seen in FIG. 2, extend along at least a portion of the length 204 of the central conductor 210. In the illustrated embodiment, common mode traps 212, 214, 216 do not extend along the entire length 204. However, in other embodiments, the common mode traps 212, 214, 216 may extend along the entire length 204, or substantially along the entire length 204 (e.g., along the entire length 204 except for portions at the end configured to couple, for example, to a processor or receive coil). The common mode traps 212, 214, 216 are disposed contiguously. As seen in FIG. 2, each of the common mode traps 212, 214, 216 is disposed contiguously to at least one other of the common mode traps 212, 214, 216. As used herein, contiguous may be understood as including components or aspects that are immediately next to or in contact with each other. For example, contiguous components may be abutting one another. It may be noted that in practice, small or insubstantial gaps may be between contiguous components in some embodiments. In some embodiments, an insubstantial gap (or conductor length) may be understood as being less than $\frac{1}{40}^{th}$ of a wavelength of a transmit frequency in free space. In some embodiments, an insubstantial gap (or conductor length) may be understood as being two centimeters or less. Contiguous common mode traps, for example, have no (or insubstantial) intervening gaps or conductors therebetween that may be susceptible to induction of current from a magnetic field without mitigation provided by a common mode trap. For example, as depicted in FIG. 1, the common mode trap 212 is contiguous to the common mode trap 214, the common mode trap 214 is contiguous to the common mode trap 212 and the common mode trap 216 (and is interposed between the common mode trap 212 and the common mode trap 216), and the common mode trap 216 is contiguous to the common mode trap 214. Each of the common mode traps 212, 214, 216 are configured to provide an impedance to the receive transmitter driven currents of an MRI system. The common mode traps 212, 214, 216 in various embodiments provide high common mode impedances. Each common mode trap 212, 214, 216, for example, may include a resonant circuit and/or one or more resonant components to provide a desired impedance at or near a desired frequency or within a target frequency range. It may be noted that the common mode traps 212, 214, 216 and/or common mode trap unit 218 may also be referred to as chokes or baluns by those in the art.

In contrast to systems having separated discrete common mode traps with spaces therebetween, various embodiments (e.g., the common mode trap assembly 200) have a portion over which common mode traps extend continuously and/or contiguously, so that there are no locations along the portion for which a common mode trap is not provided. Accordingly, difficulties in selecting or achieving particular placement locations of common mode traps may be reduced or eliminated, as all locations of interest may be included within the continuous and/or contiguous common mode trap. In various embodiments, a continuous trap portion (e.g., common mode trap unit 218) may extend along a length or portion thereof of a transmission cable. The continuous mode trap portion may be formed of contiguously joined individual common mode traps or trap sections (e.g., common mode traps 212, 214, 216). Further, contiguous common mode traps may be employed in various embodiments to at least one of lower the interaction with coil elements, distribute heat over a larger area (e.g., to prevent hot spots), or help ensure that blocking is located at desired or required positions. Further, contiguous common mode traps may be employed in various embodiments to help distribute voltage over a larger area. Additionally, continuous and/or contiguous common mode traps in various embodiments provide flexibility. For example, in some embodiments, common mode traps may be formed using a continuous length of conductor(s) (e.g., outer conductors wrapped about a central conductor) or otherwise organized as integrally formed contiguous sections. In various embodiments, the use of contiguous or continuous common mode traps (e.g., formed in a cylinder) provide for a range of flexibility over which flexing of the assembly does not substantially change the resonant frequency of the structure, or over which the assembly remains on frequency as it is flexed.

It may be noted that the individual common mode traps or sections (e.g., common mode traps 212, 214, 216) in various embodiments may be constructed or formed generally similarly to each other (e.g., each trap may be a section of a length of tapered wound coils), but each individual trap or section may be configured slightly differently than other traps or sections. For example, in some embodiments, each common mode trap 212, 214, 216 is tuned independently. Accordingly, each common mode trap 212, 214, 216 may have a resonant frequency that differs from other common mode traps of the same common mode trap assembly 200.

Alternatively or additionally, each common mode trap may be tuned to have a resonant frequency near an operating frequency of the MRI system. As used herein, a common mode trap may be understood as having a resonant frequency near an operating frequency when the resonant frequency defines or corresponds to a band that includes the operating frequency, or when the resonant frequency is close enough to the operating frequency to provide on-frequency blocking, or to provide a blocking impedance at the operating frequency.

Further additionally or alternatively, each common mode trap may be tuned to have a resonant frequency below an operating frequency of the MRI system (or each common mode trap may be tuned to have resonant frequency above an operating frequency of the MRI system). With each trap having a frequency below (or alternatively, with each trap having a frequency above) the operating frequency, the risk of any of the traps canceling each other out (e.g., due to one trap having a frequency above the operating frequency and a different trap having a frequency below the operating frequency) may be eliminated or reduced. As another example, each common mode trap may be tuned to a particular band to provide a broadband common mode trap assembly.

In various embodiments, the common mode traps may have a two or three-dimensional butterfly configuration to counteract magnetic field coupling and/or local distortions.

Figure 3:
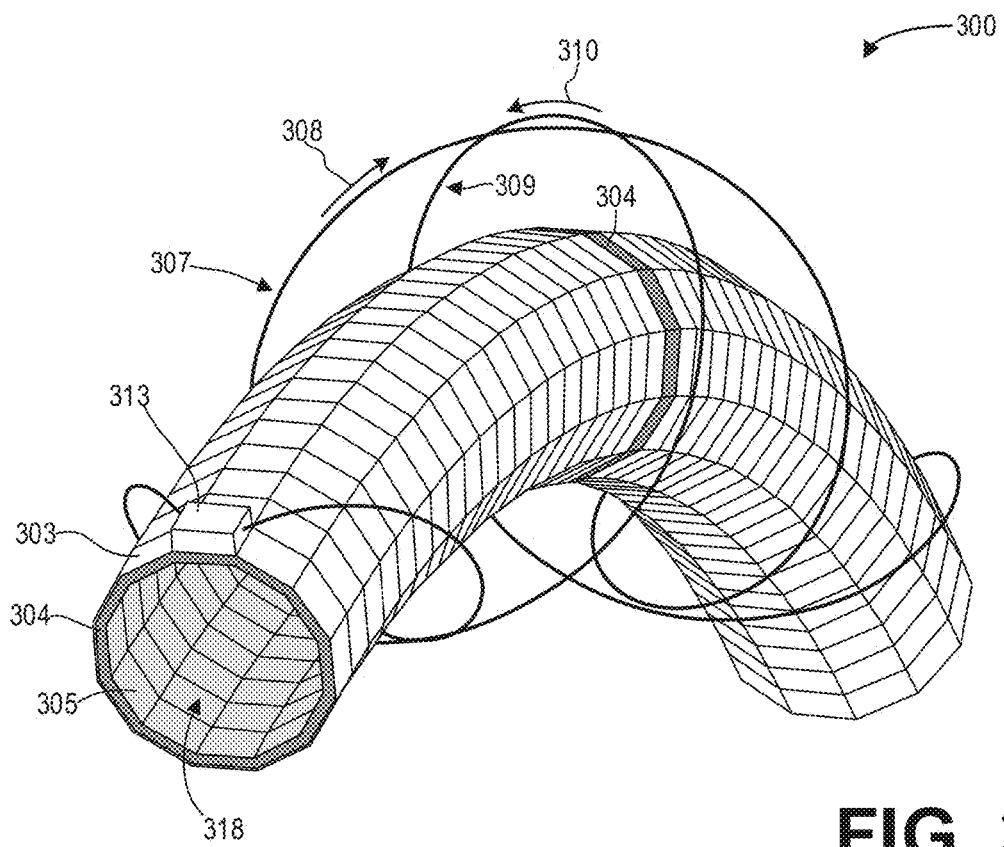
FIG. 3 is a perspective view of a common mode trap according to an embodiment of the invention.

FIG. 3 is a perspective view of a common mode trap 300 according to an embodiment of the disclosure. The common mode trap 300 includes an outer sleeve or shield 303, a dielectric spacer 304, an inner sleeve 305, a first common mode trap conductor 307, and a second common mode trap conductor 309.

The first common mode trap conductor 307 is wrapped in a spiral about the dielectric spacer 304, or wrapped in a spiral at a tapering distance from a central conductor (not shown) disposed within the bore 318 of the common mode trap 300, in a first direction 308. Further, the second common mode trap conductor 309 is wrapped in a spiral about the dielectric spacer 304, or wrapped in a spiral at a tapering distance from the central conductor disposed within the bore 318, in a second direction 310 that is opposite to the first direction 308. In the illustrated embodiment, the first direction 308 is clockwise and the second direction 310 is counter-clockwise.

The conductors 307 and 309 of the common mode trap 300 may comprise electrically-conductive material (e.g., metal) and may be shaped as ribbons, wires, and/or cables, for example. In some embodiments, the counterwound or outer conductors 307 and 309 may serve as a return path for a current passing through the central conductor. Further, in various embodiments, the counterwound conductors 307 and 309 may cross each other orthogonally (e.g., a center line or path defined by the first common mode trap conductor 307 is perpendicular to a center line or path defined by the second common mode trap conductor 309 as the common mode trap conductors cross paths) to eliminate, minimize, or reduce coupling between the common mode trap conductors.

It may be further noted that in various embodiments the first common mode trap conductor 307 and the second common mode trap conductor 309 are loosely wrapped about the dielectric spacer 304 to provide flexibility and/or to reduce any binding, coupling, or variation in inductance when the common mode trap 300 is bent or flexed. It may be noted that the looseness or tightness of the counterwound outer conductors may vary by application (e.g., based on the relative sizes of the conductors and dielectric spacer, the amount of bending or flexing that is desired for the common mode trap, or the like). Generally, the outer or counterwound conductors should be tight enough so that they remain in the same general orientation about the dielectric spacer 304, but loose enough to allow a sufficient amount of slack or movement during bending or flexing of the common mode trap 300 to avoid, minimize, or reduce coupling or binding of the counterwound outer conductors.

In the illustrated embodiment, the outer shielding 303 is discontinuous in the middle of the common mode trap 300 to expose a portion of the dielectric spacer 304 which in some embodiments is provided along the entire length of the common mode trap 300. The dielectric spacer 304, may be comprised, as a non-limiting example, of Teflon or another dielectric material. The dielectric spacer 304 functions as a capacitor and thus may be tuned or configured to provide a desired resonance. It should be appreciated that other configurations for providing capacitance to the common mode trap 300 are possible, and that the illustrated configurations are exemplary and non-limiting. For example, discrete capacitors may alternatively be provided to the common mode trap 300.

Further, the common mode trap 300 includes a first post 313 and a second post (not shown) to which the first common mode trap conductor 307 and the second common mode trap conductor 309 are fixed. To that end, the first post 313 and the second post are positioned at the opposite ends of the common mode trap, and are fixed to the outer shielding 303. The first post 313 and the second post ensure that the first and second common mode trap conductors 307 and 309 are positioned close to the outer shielding 303 at the ends of the common mode trap 300, thereby providing a tapered butterfly configuration of the counterwound conductors as described further herein.

The tapered butterfly configuration includes a first loop formed by the first common mode trap conductor 307 and a second loop formed by the second common mode trap conductor 309, arranged so that an induced current (a current induced due to a magnetic field) in the first loop 307 and an induced current in the second loop 309 cancel each other out. For example, if the field is uniform and the first loop 307 and the second loop 309 have equal areas, the resulting net current will be zero. The tapered cylindrical arrangement of the loops 307 and 309 provide improved flexibility and consistency of resonant frequency during flexing relative to two-dimensional arrangements conventionally used in common mode traps.

Generally, a tapered butterfly configuration as used herein may be used to refer to a conductor configuration that is flux cancelling, for example including at least two similarly sized opposed loops that are symmetrically disposed about at least one axis and are arranged such that currents induced in each loop (or group of loops) by a magnetic field tends to cancel out currents induced in at least one other loop (or group of loops). For example, with reference to FIG. 2, in some embodiments, counterwound conductors (e.g., conductors wound about a central member and/or axis in opposing spiral directions) may be spaced a distance radially from the central conductor 210 to form the common mode traps 212, 214, 216. As depicted in FIG. 3 and described further herein, the radial distance may be tapered towards the end of the common mode traps to reduce or altogether eliminate fringe effects. In this way, the common mode traps 212, 214, 216 may be continuously or contiguously positioned without substantial gaps therebetween.

Figure 4:
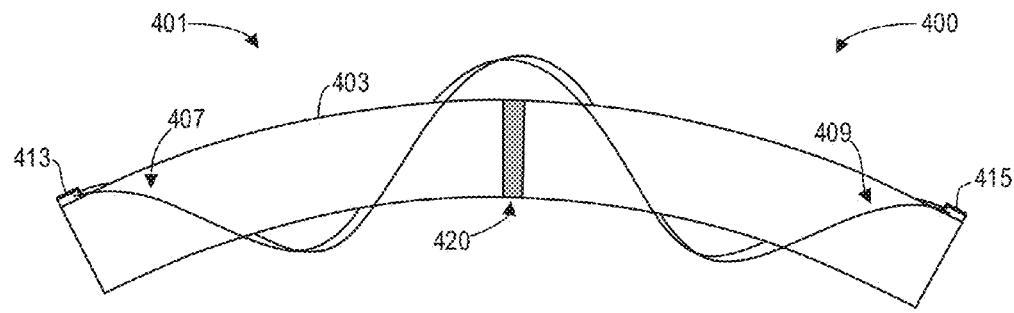
FIG. 4 is a side view of a common mode trap on a curved cable according to an embodiment of the invention.

FIG. 4 is a side view 400 of a common mode trap 401 on a curved (i.e., flexed) cable or central conductor according to an embodiment of the disclosure. As depicted, the common mode trap 401 includes an outer sleeve or shielding 403 which wraps around a cable or central conductor (not shown). The common mode trap 401 includes a first common mode trap conductor 407 and a second common mode trap conductor 409, both of which are fixed to a first post 413 and a second post 415 respectively positioned at the a first and a second end of the common mode trap 401 as depicted. The first and second common mode trap conductors 407, 409 are counterwound around the sleeve or shield 403 in a tapered spiral configuration. The tapered spiral configuration is described further herein with regard to FIGS. 5-6.

In some embodiments, the shield 403 is discontinuous in the middle of the common mode trap 401 to expose the dielectric spacer 420 which may be disposed within the shield 403 along the length of the common mode trap 401, as described above. However, it should be appreciated that different configurations of a dielectric spacer are possible, and that the depicted configuration is exemplary and non-limiting.

Figure 5:
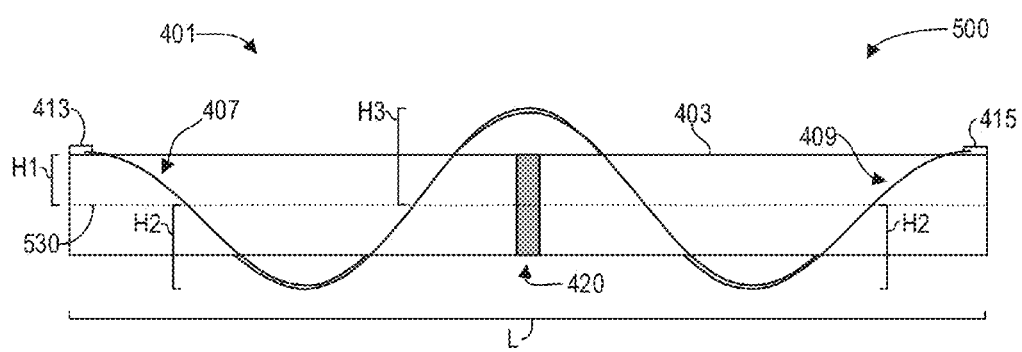
FIG. 5 is a side view of a common mode trap on a straight cable according to an embodiment of the invention.

FIG. 5 is a side view 500 of the common mode trap 401 on a straight (i.e., non-flexed) cable or central conductor according to an embodiment of the disclosure. The common mode trap 401 has a length L.

Regarding the tapered spiral configuration, it should be noted that the first and second common mode trap conductors 407 and 409 are spaced at varying radial distances or heights from a central axis 530 of the common mode trap 401. In particular, the first and second common mode trap conductors 407 and 409 are spaced a radial distance or height H1 from the central axis 530 at the posts 413 and 415. As the first and second common mode trap conductors 407 and 409 wrap around the shield 403, the conductors cross orthogonally at a radial distance H2 from the central axis 530. Further, in the middle of the common mode trap 401 (i.e., near the gap wherein the dielectric spacer 420 is exposed), the first and second common mode traps 407 and 409 cross orthogonally at a radial distance H3 from the central axis 530.

The height H1 may be configured such that the first and second common mode trap conductors 407 and 409 are positioned at or substantially close to the shield 403, while the height H3 may be configured such that the first and second common mode trap conductors 407 and 409 are positioned a desired distance away from the shield 403 where the conductors cross orthogonally in the middle of the common mode trap 401. That is, the height H3 is substantially larger than the height H1.

Further, the height H2 of the first and second common mode trap conductors 407 and 409 where they cross orthogonally may be larger than the radial distance H1 and smaller than the radial distance H3. In this way, the spiral configuration of the first and second common mode trap conductors is tapered towards the ends of the common mode trap. However, in some examples, the height H2 and the height H3 may be equal, such that the tapering of the spiral between the orthogonal crossing of the conductors 407 and 409 at the height H2 and the posts 413 and 415 is steeper than if the height H2 is smaller than the height H3. Such a configuration may be desirable, as the impedance of the common mode trap 401 is greatest when the common mode trap conductors are spaced further away from the shield 403. However, it should be appreciated that the heights H1, H2, and H3 may be configured to obtain a desired impedance of the common mode trap 401 while reducing or eliminating fringe effects at the ends of the common mode trap 401.

Further, the two off-center crossings of the conductors are both shown at a same radial distance H2, such that the tapering of the spiral is symmetric about the center of the common mode trap. However, in some embodiments the off-center crossings may be positioned at different radial distances from the central axis, such that the tapering of the spiral is asymmetric.

The spiral topology of the common mode trap is based on two counter-rotating spirals. The first spiral may be wound around the common mode trap according to:

$$x_1(\varphi) = f(\varphi)\cos(\varphi),$$
$$y_1(\varphi) = f(\varphi)\sin(\varphi), \text{ and}$$
$$z_1(\varphi) = \frac{L}{4\pi}\varphi,$$

where $f(\varphi)$ represents the radius of the spiral at the azimuthal angle $\varphi$. Similarly, the second spiral may be wound around the common mode trap according to:

$$x_2(\varphi) = f(\varphi)\cos(\varphi),$$
$$y_2(\varphi) = -f(\varphi)\sin(\varphi), \text{ and}$$
$$z_1(\varphi) = \frac{L}{4\pi}\varphi.$$

According to the condition of orthogonality of the two spirals, in order to achieve the minimal mutual inductance between the spirals, the relationship between the length L of the common mode trap and its maximum radius $R_{max}$ is:

$$f(0) = \frac{L}{4\pi} = R_{max}.$$

If the function $f(\varphi)$ is a constant value, say $R_{max}$, along the entire common mode trap length L, then the common mode trap topology corresponds to prior approaches to common mode traps.

Further, the function $f(\varphi)$ may be chosen as a symmetric function. For example, the function $f(\varphi)$ may be symmetric about the center of the common mode trap with a tapering shape built-in between the minimum radius $R_{min}$ and the maximum radius $R_{max}$ along the common mode trap length L, defined as:

$$f(\varphi - \varphi_0) = R_{max} - \frac{(R_{max} - R_{min})}{(2\pi)^n}|\varphi - \varphi_0|^n,$$

where $\varphi_0$ comprises the azimuthal angle at which the spirals are at maximum radius (e.g., at the center of the common mode trap where the spirals cross), and where n comprises a tapering order. As n increases from 0, the tapering of the spirals towards the ends of the common mode trap becomes steeper. Thus, in the design of the common mode trap, the value of the tapering order n selected may be adjusted to selectively control the fringe field, and thus to increase the number of common mode traps per unit length of the cable or central conductor. Example common mode trap configurations with different tapering orders n are described further herein with regard to FIG. 15.

Figure 6:
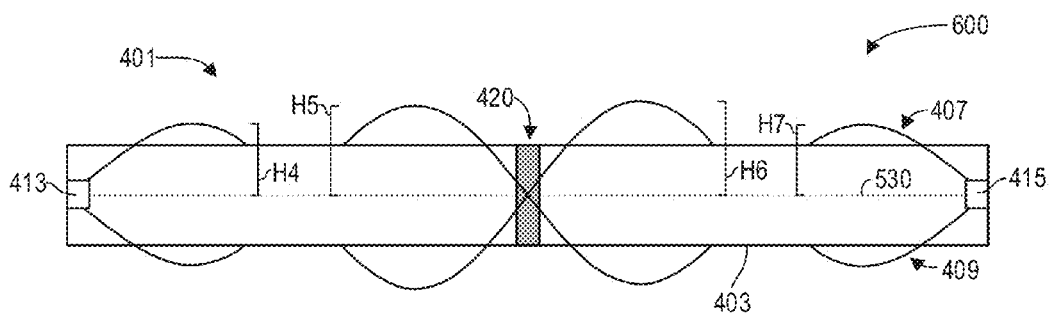
FIG. 6 is a top view of a common mode trap on a straight cable according to an embodiment of the invention.

FIG. 6 is a top view 600 of the common mode trap 401 on a straight cable or central conductor according to an embodiment of the disclosure. The tapered spiral configuration of the first and second common mode trap conductors 407 and 409 is evident in the varying radial distances H4, H5, H6, and H7 of the first and second common mode trap conductors 407 and 409.

Closer to the post 413, the first and second common mode trap conductors 407 and 409 are spaced a radial distance H4 from the central axis 530 of the common mode trap 401. Meanwhile, closer to the orthogonal crossing of the conductors 407 and 409 near the exposed portion of the dielectric spacer 420, the first and second conductors 407 and 409 are spaced a radial distance H5 from the central axis 530 of the common mode trap 401. In some embodiments, the radial distance H4 is less than the radial distance H5. In this way, the spiral configuration of the first and second conductors 407 and 409 is tapered towards the post 413.

Similarly, towards the post 415, the first and second conductors are spaced a radial distance H7 from the central axis 530, while closer to the central crossing the conductors are spaced a radial distance H6 from the central axis 530. The radial distance H6 may be greater than the radial distance H7, thereby providing a tapering of the spiral configuration of the first and second conductors 407 and 409 towards the post 415.

In some embodiments, the radial distances H4 and H7 are equal, and the radial distances H5 and H6 are equal. In this way, the tapering of the conductors may be symmetric about the middle of the common mode trap 401. However, in other embodiments the radial distances may be differently configured such that the tapering of the spiral is asymmetric.

Figure 7:
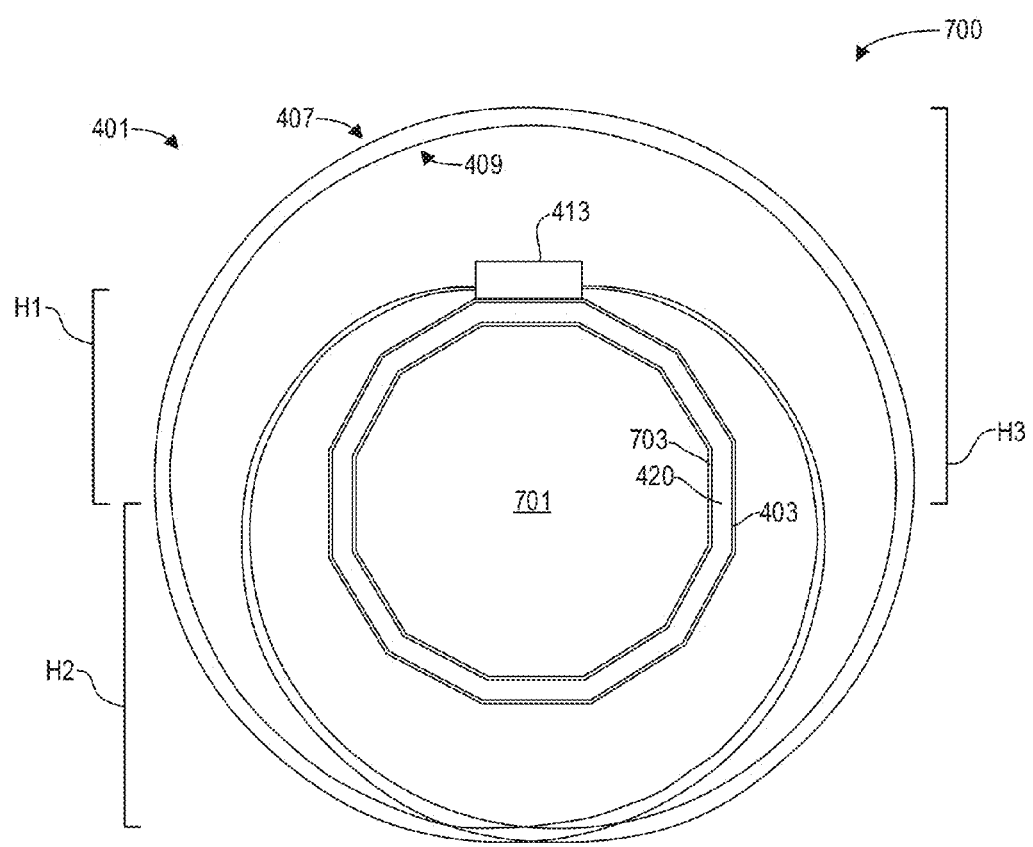
FIG. 7 is a front view of a common mode trap on a straight cable according to an embodiment of the invention.

FIG. 7 is a front view 700 of the common mode trap 401 on a straight cable or central conductor 701 according to an embodiment of the disclosure. In the cross-sectional front view 700, the central conductor 701 is visible, as well as the inner sleeve 703 of the common mode trap 401. Further, front view 700 clearly illustrates the differing heights or radial distances H1, H2, and H3 of the first and second common mode trap conductors 407 and 409 from the central axis of the shield 403. As described above, the first height H1 denotes the radial distance of the first and second conductors from the central axis at the post 413, the second height or radial distance H2 denotes the radial distance of the first and second conductors at the off-center orthogonal crossings, and the third height or radial distance H3 denotes the radial distance of the first and second conductors at the central orthogonal crossing.

In some embodiments, H1 may be smaller than H2, which in turn may be smaller than H3. However, in other embodiments, H2 and H3 may be equal, and further may be larger than H1 to provide a steeper tapering of the first and second conductors and an improved common mode control with respect to other configurations.

Further, while the height H1 as depicted shows the first and second conductors 407 and 409 spaced a distance away from the shield 403, in some examples the height H1 may be configured such that the first and second conductors 407 and 409 are positioned at the shield 403 (i.e., with no substantial distance between the conductors and the shield).

The tapered spiral configuration of the common mode trap conductors described herein above is particularly advantageous when multiple common mode trap conductors are contiguously disposed in a common mode trap assembly. As an illustrative example, FIG. 8 is a perspective view of a common mode trap assembly 800 on a curved cable according to an embodiment of the disclosure. Common mode trap assembly 800 includes a first common mode trap 805 and a second common mode trap 825 positioned adjacent to each other on a central conductor 801.

The first common mode trap 805 includes a first common mode trap conductor 807 and a second common mode trap conductor 809 counterwound in a tapered spiral configuration. To that end, the first and second conductors 807 and 809 are fixed to posts 813 and 815. It should be noted that the posts 813 and 815 are aligned on a same side of the common mode trap 805.

Similarly, the second common mode trap 825 includes a third common mode trap conductor 827 and a fourth common mode trap conductor 829 counterwound in a tapered spiral configuration and fixed to posts 833 and 835. It should be noted that the posts 833 and 835 are aligned on a same side of the common mode trap 825.

As depicted, the common mode traps 805 and 825 are separated by a distance D1, thereby exposing the central conductor 801 in the gap 820 between the common mode traps. Due to the tapering spiral configuration of the common mode trap conductors of the common mode traps, the gap 820 can be minimized or altogether eliminated in order to increase the density of common mode traps in a common mode trap assembly without loss of impedance functions of the common mode traps. That is, the distance D1 can be made arbitrarily small such that the common mode traps are in face-sharing contact, given the tapered spiral configuration.

It should be appreciated that while the common mode trap assembly 800 includes two common mode traps 805 and 825, in practice a common mode trap assembly may include more than two common mode traps.

Further, the common mode traps 805 and 825 of the common mode trap assembly 800 are aligned such that the posts 813, 815, 833, and 855 are aligned on a same side of the common mode trap assembly. However, in examples where cross-talk between the common mode traps may be possible, for example if the tapering of the counterwound conductors is more severe or steep, the common mode traps may be rotated with respect to one another to further reduce fringe effects and/or cross-talk between the traps. Such an embodiment is described herein below with regard to FIG. 9.

FIG. 9 is a perspective view of a common mode trap assembly 900 in a rotated configuration on a curved cable 901 according to an embodiment of the disclosure. Common mode trap assembly 900 includes a first common mode trap 905 and a second common mode trap 925.

Similar to the embodiments described above, the first common mode trap 905 includes a first common mode trap conductor 907 and a second common mode trap conductor 909, both of which are fixed to posts 913 and 915. The posts 913 and 915 are aligned on a same side of the common mode trap 905.

Meanwhile, the second common mode trap 925 includes a third common mode trap conductor 927 and a fourth common mode trap conductor 929, both of which are fixed to posts 933 and 935. The posts 933 and 935 are aligned on a same side of the common mode trap 925.

However, in contrast with the common mode trap assembly 800 described herein above, the common mode traps 905 and 925 are rotated with respect to one another. In particular, the common mode trap 925 is rotated about the central conductor 901 by 90 degrees with respect to the common mode trap 905. As depicted, the rotation of the common mode trap 925 with respect to the common mode trap 905 causes the posts 933 and 935, and consequently the conductors 927 and 929, to rotate with respect to the posts 913 and 915.

It should be appreciated that while a rotation of 90 degrees is depicted, in some embodiments a common mode trap may be rotated about the central conductor by 180 degrees with respect to an adjacent common mode trap. Further, the rotation may be performed to a degree other than 90 or 180 degrees. For example, a common mode trap may be rotated to any desired degree about the central conductor in order to sufficiently minimize the gap 920 which has a distance D2. Thus, even if the tapered spiral configuration of the common mode traps is steep such that some fringe magnetic field effect may be present, the common mode traps may be positioned (i.e., rotated) with respect to each other to minimize or avoid coupling of the common mode traps.

FIG. 10 shows a graph 1000 illustrating magnetic field strength controlled by a common mode trap 1002 according to an embodiment of the disclosure. In particular, graph 1000 illustrates how the common mode trap 1002 controls a magnetic field surrounding a cable or central conductor 1001 that is excited by a plane wave.

Similar to the common mode traps described herein above, common mode trap 1002 includes an outer sleeve or shielding 1003 which surrounds a dielectric spacer (not shown) and a central conductor 1001. Common mode trap 1002 further includes a first common mode trap conductor 1007 and a second common mode trap conductor 1009, both of which are fixed to posts 1013 and 1015. It should be noted that, for simplicity, only portions of conductors 1007 and 1009 are depicted.

The strength of the magnetic field is denoted by the shaded portions of the graph 1000. Example field strengths corresponding to the shaded areas is provided by legend 1025, which indicates that darker areas correspond to regions of higher field strength.

As depicted, the first and second common mode trap conductors 1007 and 1009 effectively contain the magnetic field. The darkest regions are almost entirely contained within the volume defined by the conductors 1007 and 1009, and the strength of the magnetic field rapidly drops off away from the common mode trap 1002. In particular, the field is strongest in the regions 1030, 1032, 1034, 1036, and 1038 within the volume defined by the common mode trap conductors 1007 and 1009. Due to the tapering of the conductors 1007 and 1009 towards the ends of the common mode trap 1002, the regions 1030 and 1038 where the magnetic field is strongest are well-contained within the volumes defined by the common mode trap conductors, as the tapering causes these volumes to be smaller with respect to the regions 1032, 1034, and 1036. That is, the tapering of the conductors 1007 and 1009 towards the posts 1013 and 1015 ensures that magnetic fields at the ends of the common mode trap 1002 (e.g., in regions 1030 and 1038) are small, while the larger volumes in the regions 1032, 1034, 1036 allow for larger magnetic fields away from the cable 1001 (but constrained by the conductors 1007 and 1009) while also ensuring sufficient impedance of the common mode trap 1002. The larger magnetic fields in regions 1032, 1034, and 1036 are acceptable because these regions are further away from other common mode traps.

To illustrate the effectiveness of the tapered spiral configuration, FIG. 11 shows a graph 1100 illustrating magnetic field strength controlled by a common mode trap assembly 1103 according to an embodiment of the disclosure. The common mode trap 1103 includes a first common mode trap 1105 and a second common mode trap 1125 which are positioned on a central conductor or cable 1101. The first common mode trap 1105 includes a first common mode trap conductor 1107 and a second common mode trap conductor 1109, both of which are fixed to posts 1113 and 1115. Similarly, the second common mode trap 1125 includes a third common mode trap conductor 1127 and a fourth common mode trap conductor 1129, both of which are fixed to posts 1133 and 1135. The strength of the magnetic field is denoted by the various shaded areas, for which example field strengths are indicated in legend 1125.

As with the single common mode trap 1002 described herein above, the magnetic field is strongly constrained at the ends of the individual common mode traps 1105 and 1125 due to the tapering of the conductors 1107, 1109, 1127, 1129. As a result, cross-talk between the common mode traps 1105 and 1125 is minimized or altogether eliminated. In this way, coupling of the common mode traps 1105 and 1125 can be avoided, so that in turn the tuning of the traps is not affected.

FIG. 11 shows a gap 1132 between the common mode traps 1105 and 1125. However, since the tapered spiral configuration of the counterwound conductors 1107, 1109, 1127, 1129 minimizes cross-talk, the gap 1132 between the common mode traps 1105 and 1125 can be reduced, if not altogether eliminated, so that the common mode traps 1105 and 1125 are in face-sharing contact. In this way, the density of common mode traps in a common mode trap assembly can be increased.

FIG. 12 is a high-level block diagram illustrating an example method 1200 for a common mode trap according to an embodiment of the disclosure. Method 1200 begins at 1205. At 1205, method 1200 includes providing a central conductor. The central conductor may be configured, for example, generally similarly to the central conductor 210 described herein above. For example, the central conductor may comprise a transmission cable of an MRI machine configured to couple an RF coil to one or more processing elements.

At 1210, method 1200 includes disposing a dielectric spacer about the central conductor. Specifically, the dielectric spacer may be disposed radially about the central conductor and may extend along at least a portion of the length of the central conductor. For example, the dielectric spacer may have a through-hole or bore pre-formed therethrough that is sized to accept the central conductor, and may be secured in place to an outer sleeve of the central conductor at one or more locations. The dielectric spacer may be configured, for example, generally similarly to the dielectric spacer 304 described herein above. Further, an outer sleeve or shielding may be provided about the dielectric spacer 304. In some examples, the outer sleeve may be discontinuous to expose at least a portion of the dielectric spacer.

At 1215, method 1200 includes wrapping a first common mode trap conductor in a spiral about the dielectric spacer in a first direction with a tapered radial distance. The first common mode trap conductor may comprise, as a non-limiting example, a ribbon conductor or a wire. The spiral form of the first common mode trap conductor may be tapered such that the ends of the first common mode trap conductor is substantially close to the ends of the dielectric spacer, while the middle of the first common mode trap conductor is spaced a radial distance away from the dielectric spacer.

At 1220, method 1200 includes wrapping a second common mode trap conductor about the dielectric spacer in a second direction with a tapered radial distance. As described herein above, the second direction may be opposite to the first direction. For example, the second common mode trap conductor may be wrapped in a spiral having a similar pitch to a spiral defined by the first common mode trap conductor, but in a different direction (e.g., clockwise versus counter-clockwise). It should be noted that the first and second common mode trap conductors may be wrapped sufficiently loosely about the dielectric spacer so that the common mode trap conductors will not bind or couple to each other if the central conductor and dielectric spacer are bent or flexed. The spiral formed by the second common mode trap conductor may be tapered as described herein above.

At 1225, method 1200 includes coupling the transmission cable formed by the central conductor, dielectric spacer, and first and second common mode trap conductors, to components of an MRI system within a bore of the MRI system. For example, the transmission cable is coupled to at least one processing component of the MRI system (e.g., the T/R switch and/or the data acquisition system) and an RF coil. In particular, one end of the transmission cable is connected to the processing component and the other end of the transmission cable is connected to the RF coil. Accordingly, the transmission cable may be used, for example, to transmit signals from a receive coil to the processing component for use in image reconstruction. As another example, the transmission cable is disposed within, or as a part of, the RF coil. Method 1200 may then end.

Another approach to increasing the density of common mode traps in a common mode trap assembly is to trim the exterior shielding of each common mode trap such that the common mode traps can be overlapped or interleaved. FIG. 13 is a perspective view of an example common mode trap 1300 with a trimmed shielding 1303 according to an embodiment of the invention. Common mode trap 1300 includes an inner sleeve 1305, a dielectric spacer 1304, an exterior shield 1303, a first common mode trap conductor 1307, and a second common mode trap conductor 1309. The common mode trap conductors 1307 and 1309 are counterwound in a spiral configuration as described above. In contrast with the embodiments described herein above, for example the common mode trap 300 in FIG. 3 wherein the exterior shield 303 fully extends to the end of the common mode trap 300, the exterior shield 1303 of common mode trap 1300 is trimmed towards the ends of the common mode trap 1300 such that the dielectric spacer 1304 is further exposed. In one example, the exterior shielding is not present in regions towards the ends of the common mode trap, at least on the opposite side of the posts (not shown, but similar to embodiments described herein above).

By trimming the shielding as depicted in FIG. 13, common mode traps can be interleaved or overlapped to further increase the density of common mode traps per unit length of a cable. FIG. 14 is a side view of an example common mode trap assembly 1400 comprising a plurality of common mode traps with trimmed shielding according to an embodiment of the invention. Common mode trap assembly 1400 includes a first common mode trap 1401, a second common mode trap 1421, and a third common mode trap 1441. Note that only portions of common mode traps 1421 and 1441 are illustrated.

The shielding 1403 of the first common mode trap 1401 is trimmed as described herein above with regard to FIG. 13. Similarly, the shielding 1423 of the second common mode trap 1421 and the shielding 1443 of the third common mode trap 1441 are trimmed. The common mode traps 1401, 1421, 1441 may include a common dielectric spacer 1404. Further, the second and third common mode traps 1421 and 1441 are rotated 180 degrees with respect to the first common mode trap 1401, such that the post 1434 of the second common mode trap 1421 is located on an opposite side of the common mode trap assembly 1400 to the post 1413 of the first common mode trap 1401. Similarly, the post 1453 of the third common mode trap 1441 is located on an opposite side of the common mode trap assembly 1400 to the post 1415 of the first common mode trap 1401. The common mode conductors 1407, 1427, and 1447 of the common mode traps are fixed to the posts 1413, 1415, 1423, and 1453 as depicted.

By trimming the shields, the common mode traps 1401, 1421, and 1441 may be overlapped such that the posts 1413 and 1415 of the first common mode trap 1401 overlap the second and third common mode traps 1421 and 1441, as depicted. In this way, coupling between common mode traps of a common mode trap assembly may be reduced or eliminated, while the density of the common mode traps per unit length of a cable is increased.

Yet another approach to controlling the fringe fields of a common mode trap includes adjusting the tapering order of the spiral-wound conductors, as described herein above with regard to FIG. 4. As an illustrative example, FIG. 15 shows a plurality of common mode trap configurations 1500 with different tapering orders according to an embodiment of the invention. Each configuration 1501, 1511, 1521, and 1531 illustrates a different tapering order n. For simplicity, each configuration only depicts a central conductor and the common mode trap conductors wound thereabout.

The tapering order n of common mode trap 1501 is 0.5, such that the tapering of the common mode trap conductors 1505 and 1507 towards the end of the cable 1502 is small. The tapering order n of common mode trap 1511 is 1, such that the tapering of the common mode trap conductors 1515 and 1517 towards the end of the cable 1512 is slightly steeper than in the common mode trap 1501. The tapering order n of common mode trap 1521 is 6, such that the tapering of the common mode trap conductors 1525 and 1527 towards the end of the cable 1522 is increased, and is visibly larger than the common mode traps 1501 and 1511. Finally, the tapering order n of common mode trap 1531 is 1000, such that the tapering of the common mode trap conductors 1535 and 1537 towards the end of the cable 1532 is very steep in comparison to the common mode traps 1501, 1511, and 1521.

As the tapering order n increases, the fringe fields of the common mode trap also increases, so coupling between common mode traps increases as the tapering order increases. Thus, lower tapering orders may be desirable, though the variability of the tapering order allows for optimal design of a common mode trap assembly.

The technical effect of the disclosure may include improved performance of MRI systems due to reduced interaction between transmission cables and coil elements. Another technical effect of the disclosure may include improved heat distribution, for example by distributing heat generated by common mode traps over a larger area and/or reducing, minimizing, or preventing hot spots. Yet another technical effect of the disclosure may include ensuring that common mode blocking or trapping is provided at all appropriate locations along a transmission cable. Another technical effect of the disclosure may include the improved flexibility of common mode trap assemblies. Yet another technical effect of the disclosure may include the rotation of common mode traps with respect to each other. Another technical effect of the disclosure may include the tapering of common mode trap conductors.

In one embodiment, a common mode trap for a magnetic resonance imaging (MRI) apparatus comprises: a first conductor and a second conductor counterwound around a length of a central conductor, wherein the first and the second conductors are radially spaced a first distance from the central conductor at first and second ends of the length, and wherein the first and the second conductors are radially spaced a second distance larger than the first distance from the central conductor at a midpoint of the length.

In a first example of the common mode trap, the common mode trap further comprises a dielectric spacer disposed radially about the central conductor along the length, wherein the first and the second conductors are counterwound around the dielectric spacer. In a second example of the common mode trap optionally including the first example, the dielectric spacer has a circular cross-section. In a third example of the common mode trap optionally including one or more of the first and second examples, the first and the second conductors cross paths orthogonally. In a fourth example of the common mode trap optionally including one or more of the first through third examples, the common mode trap further includes a first post positioned at the first end and a second post positioned at the second end, wherein the first conductor and the second conductor are fixed to the first and the second posts. In a fifth example of the common mode trap optionally including one or more of the first through fourth examples, the first post and the second post are positioned on a same side of the common mode trap. In a sixth example of the common mode trap optionally including one or more of the first through fifth examples, the common mode trap is tuned to provide a resonant frequency near an operating frequency of the MRI system.

In another embodiment, a common mode trap assembly for a magnetic resonance imaging (MRI) system comprises: a central conductor with a length and configured to transmit a signal between an MRI radio frequency coil and a processing element of the MRI system; and a plurality of common mode traps extending along at least a portion of the length of the central conductor, the common mode traps configured to provide an impedance to reduce transmitter-driven currents of the MRI system, wherein each of the common mode traps comprises a second length and includes a first conductor and a second conductor counterwound around the central conductor, wherein the first and the second conductors are radially spaced a first distance from the central conductor at first and second ends of the second length, and wherein the first and the second conductors are radially spaced a second distance larger than the first distance from the central conductor at a midpoint of the second length.

In a first example of the common mode trap assembly, each of the common mode traps includes a first post positioned at a first end of the common mode trap and a second post positioned at a second end of the common mode trap, wherein the first and second common mode trap conductors of the common mode trap are fixed to the first and the second posts. In a second example of the common mode trap assembly optionally including the first example, the first and second posts of each common mode trap are aligned with the first and second posts of the other common mode traps. In a third example of the common mode trap assembly optionally including one or more of the first and second examples, the first and second posts of at least one of the common mode traps is rotated with respect to the first and second posts of at least one other common mode trap. In a fourth example of the common mode trap assembly optionally including one or more of the first through third examples, the first and second posts of at least one of the common mode traps is rotated 180 degrees with respect to the first and second posts of at least one other common mode trap. In a fifth example of the common mode trap assembly optionally including one or more of the first through fourth examples, each of the plurality of common mode traps are disposed contiguously. In a sixth example of the common mode trap assembly optionally including one or more of the first through fifth examples, each of the common mode traps includes a dielectric spacer disposed radially about the central conductor.

In yet another embodiment, a method for providing a transmission cable for a radio frequency (RF) coil of a magnetic resonance imaging (MRI) system comprises: providing a central conductor of a length and configured to transmit a signal between the RF coil and a processing element of the MRI system; wrapping a first common mode trap conductor in a tapered spiral in a first direction about the central conductor along at least a portion of the length of the central conductor; and wrapping a second common mode trap conductor in a tapered spiral in a second direction opposite to the first direction about the central conductor along the portion of the length.

In a first example of the method, the first and the second common mode trap conductors are positioned a first distance radially from a central axis of the central conductor at a first and a second end of the length. In a second example of the method optionally including the first example, the first and the second common mode trap conductors are positioned a second distance radially from the central axis at a midpoint of the length, the second distance greater than the first distance. In a third example of the method optionally including one or more of the first and second examples, the first and the second common mode trap conductors are fixed to posts positioned at a first and a second end of the length. In a fourth example of the method optionally including one or more of the first through third examples, the method further comprises providing a dielectric spacer radially along the length of the central conductor. In a fifth example of the method optionally including one or more of the first through fourth examples, the method further comprises providing a shielding radially around the dielectric spacer.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A common mode trap for a magnetic resonance imaging (MRI) apparatus, comprising:
  a first conductor and a second conductor counterwound around a length of a central conductor, wherein the first and the second conductors are radially spaced a first distance from the central conductor at first and second ends of the length, wherein the first and the second conductors are radially spaced a second distance larger than the first distance from the central conductor at a midpoint of the length, and wherein a radial distance of the first and the second conductors tapers from the second distance at the midpoint to the first distance at the first and the second ends of the length.

2. The common mode trap of claim 1, further comprising a dielectric spacer disposed radially about the central conductor along the length, wherein the first and the second conductors are counterwound around the dielectric spacer.

3. The common mode trap of claim 2, wherein the dielectric spacer has a circular cross-section.

4. The common mode trap of claim 1, wherein the first and the second conductors cross paths orthogonally.

5. The common mode trap of claim 1, further including a first post positioned at the first end and a second post positioned at the second end, wherein the first conductor and the second conductor are fixed to the first and the second posts.

6. The common mode trap of claim 5, wherein the first post and the second post are positioned on a same side of the common mode trap.

7. The common mode trap of claim 1, wherein the common mode trap is tuned to provide a resonant frequency near an operating frequency of the MRI apparatus.

8. A common mode trap assembly for a magnetic resonance imaging (MRI) system, comprising:
  a central conductor with a length and configured to transmit a signal between an MRI radio frequency coil and a processing element of the MRI system; and
  a plurality of common mode traps extending along at least a portion of the length of the central conductor, the common mode traps configured to provide an impedance to reduce transmitter-driven currents of the MRI system, wherein each of the common mode traps comprises a second length and includes a first conductor and a second conductor counterwound around the central conductor, wherein the first and the second conductors are radially spaced a first distance from the central conductor at first and second ends of the second length, wherein the first and the second conductors are radially spaced a second distance larger than the first distance from the central conductor at a midpoint of the second length, and wherein a radial distance of the first and the second conductors tapers from the second distance at the midpoint of the second length to the first distance at the first and the second ends of the second length.

9. The common mode trap assembly of claim 8, wherein each of the common mode traps includes a first post positioned at a first end of the common mode trap and a second post positioned at a second end of the common mode trap, wherein the first and the second common mode trap conductors of the common mode trap are fixed to the first and the second posts.

10. The common mode trap assembly of claim 9, wherein the first and the second posts of each common mode trap are aligned with the first and the second posts of the other common mode traps.

11. The common mode trap assembly of claim 9, wherein the first and the second posts of at least one of the common mode traps is rotated with respect to the first and the second posts of at least one other common mode trap.

12. The common mode trap assembly of claim 9, wherein the first and the second posts of at least one of the common mode traps is rotated 180 degrees with respect to the first and the second posts of at least one other common mode trap.

13. The common mode trap assembly of claim 8, wherein each of the plurality of common mode traps is disposed contiguously.

14. The common mode trap assembly of claim 8, wherein each of the common mode traps includes a dielectric spacer disposed radially about the central conductor.

15. A method for providing a transmission cable for a radio frequency (RF) coil of a magnetic resonance imaging (MRI) system, comprising:
   providing a central conductor of a length and configured to transmit a signal between the RF coil and a processing element of the MRI system;
   wrapping a first common mode trap conductor in a tapered spiral in a first direction about the central conductor along at least a portion of the length of the central conductor; and
   wrapping a second common mode trap conductor in a tapered spiral in a second direction opposite to the first direction about the central conductor along the portion of the length, wherein the tapered spiral of the first and the second common mode trap conductors includes a tapering in radial distance from a midpoint of the portion of the length towards a first end and a second end of the portion of the length.

16. The method of claim 15, wherein the first and the second common mode trap conductors are positioned a first distance radially from a central axis of the central conductor at the first and the second ends of the portion of the length.

17. The method of claim 16, wherein the first and the second common mode trap conductors are positioned a second distance radially from the central axis at the midpoint of the portion of the length, the second distance greater than the first distance.

18. The method of claim 15, wherein the first and the second common mode trap conductors are fixed to posts positioned at the first and the second ends of the portion of the length.

19. The method of claim 15, further comprising providing a dielectric spacer radially along the length of the central conductor.

20. The method of claim 19, further comprising providing a shielding radially around the dielectric spacer.

* * * * *